United States Patent
Liu et al.

(10) Patent No.: US 10,403,721 B2
(45) Date of Patent: Sep. 3, 2019

(54) FIELD EFFECT TRANSISTOR, MEMORY ELEMENT AND MANUFACTURING METHOD OF CHARGE STORAGE STRUCTURE USING PARAELECTRIC AND FERROELECTRIC MATERIAL

(71) Applicant: NUSTORAGE TECHNOLOGY CO., LTD., Apia (WS)

(72) Inventors: Fu-Chou Liu, Hsin-Chu County (TW); Yung-Tin Chen, Taoyuan (TW)

(73) Assignee: NUSTORAGE TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 15/862,093

(22) Filed: Jan. 4, 2018

(65) Prior Publication Data

US 2018/0366547 A1    Dec. 20, 2018

(30) Foreign Application Priority Data

Jun. 14, 2017    (CN) .......................... 2017 1 0447617

(51) Int. Cl.
*H01L 29/10* (2006.01)
*H01L 29/66* (2006.01)
(Continued)

(52) U.S. Cl.
CPC ........ *H01L 29/1062* (2013.01); *G11C 11/223* (2013.01); *G11C 19/282* (2013.01); *H01L 29/516* (2013.01); *H01L 29/66007* (2013.01)

(58) Field of Classification Search
CPC ........... H01L 29/1062; H01L 29/66007; H01L 29/516; G11C 19/282; G11C 11/35; G11C 27/04
See application file for complete search history.

(56) References Cited

U.S. PATENT DOCUMENTS

| 2014/0254276 A1* | 9/2014 | Tokuhira | G11C 11/22 365/185.17 |
| 2016/0181066 A1* | 6/2016 | Brors | H01M 4/0423 429/219 |
| 2017/0194657 A1* | 7/2017 | Suzuki | H01M 8/0206 |

OTHER PUBLICATIONS

YouTube Power Point Presentation "Dielectric and Ferroelectric Properties of Materials" by Prof. P. Ravindran, Department of Physics, Central University of Tamil Nadu, India on Apr. 2014. Retrieved from the Internet: http://folk.uio.no/ravi/cutn/pmat/8.Ferroelectric.pdf (Slide No. 25).*

* cited by examiner

*Primary Examiner* — Harry W Byrne
*Assistant Examiner* — Sultana Begum
(74) *Attorney, Agent, or Firm* — Li & Cai Intellectual Property (USA) Office

(57) ABSTRACT

A field effect transistor, a memory element, and a manufacturing method of a charge storage structure are provided. The memory element includes a plurality of field effect transistors, and each of the field effect transistors includes a substrate, a source region, a drain region, a gate conductive layer, and a charge storage structure. Both the source region and the drain region are located in the substrate and connected to an upper surface of the substrate. The source and drain regions are spaced apart from each other to define a channel region therebetween. The gate conductive layer is disposed over the upper surface and overlaps with the channel region. The charge storage structure disposed between the gate conductive layer and the channel region includes a ferroelectric material and a paraelectric material so that the charge storage structure has better capability of trapping charges and a higher switching speed.

15 Claims, 6 Drawing Sheets

(51) Int. Cl.
*H01L 29/51* (2006.01)
*G11C 19/28* (2006.01)
*G11C 11/22* (2006.01)

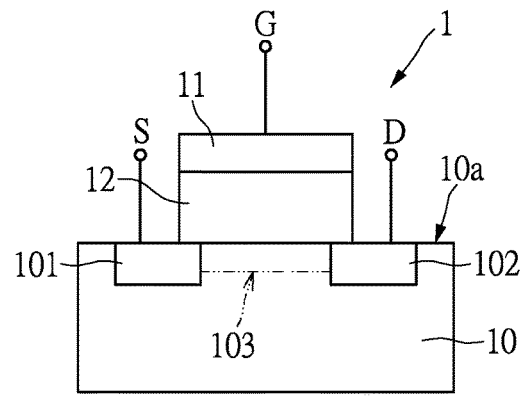
FIG. 1
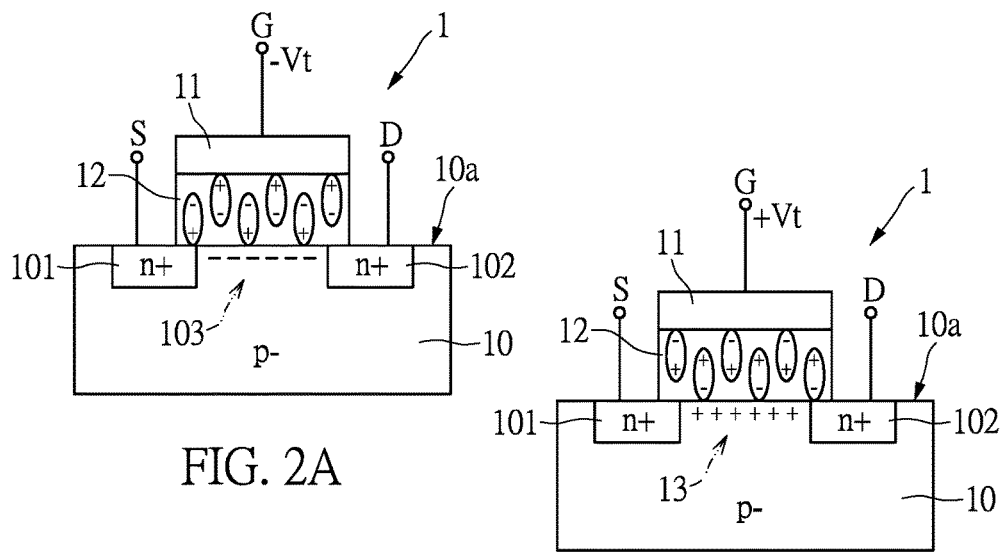
FIG. 2A
FIG. 2B

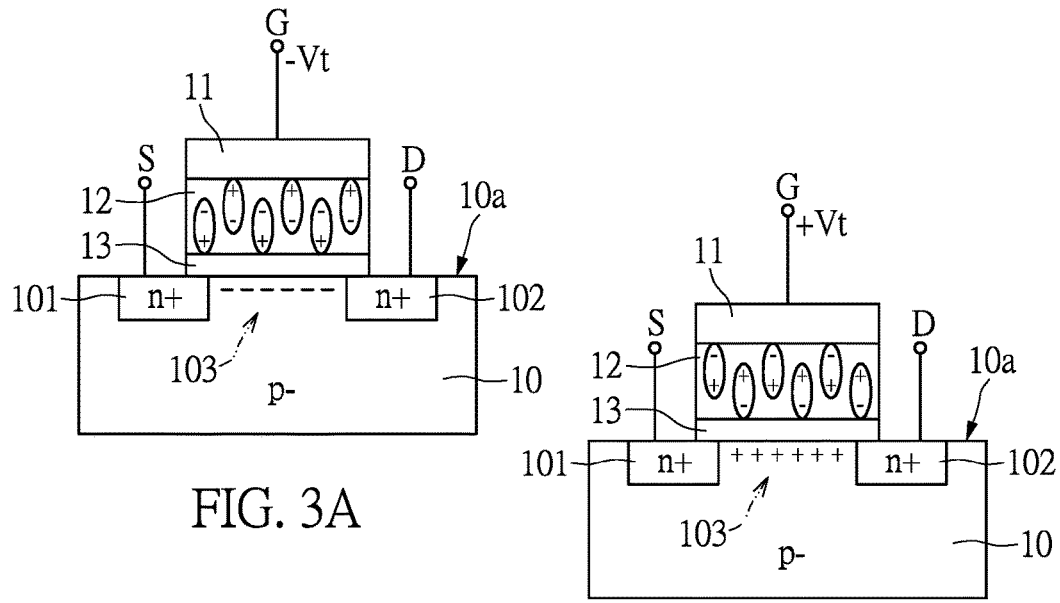
FIG. 3A
FIG. 3B
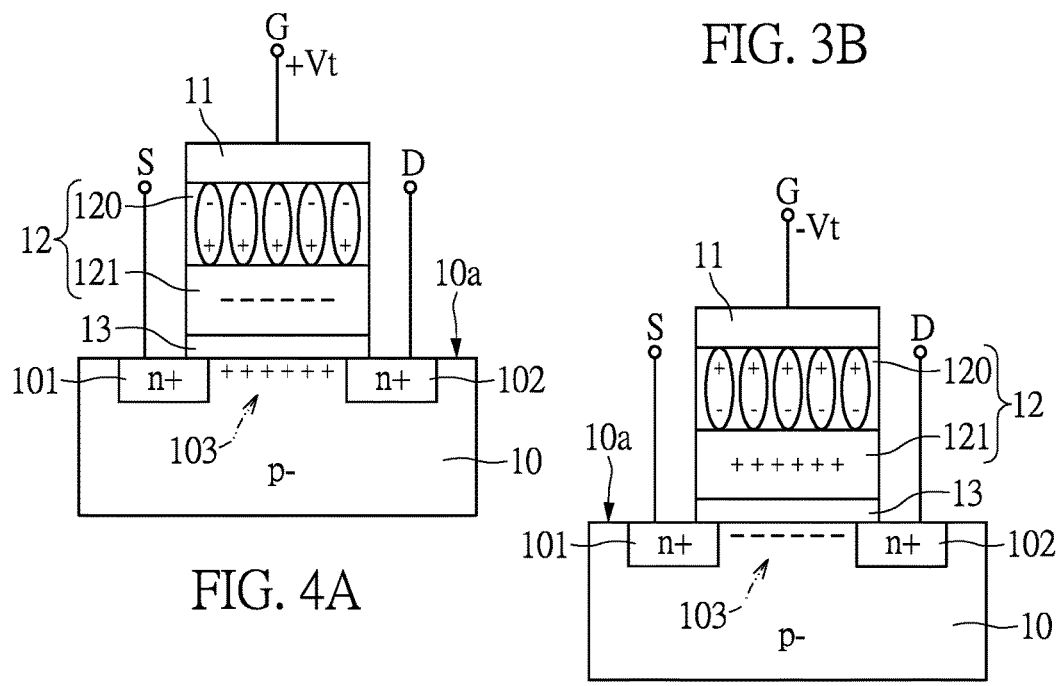
FIG. 4A
FIG. 4B

FIELD EFFECT TRANSISTOR, MEMORY ELEMENT AND MANUFACTURING METHOD OF CHARGE STORAGE STRUCTURE USING PARAELECTRIC AND FERROELECTRIC MATERIAL

BACKGROUND OF THE INVENTION

1. Field of the Invention

The disclosure relates to a field effect transistor, a memory element and a manufacturing method of a charge storage structure; in particular, to field effect transistor, a memory element and a manufacturing method of a charge storage structure applying a paraelectric material and a ferroelectric material.

2. Description of Related Art

Currently existing ferroelectric field effect transistors ("FeFET") can be applied in a nonvolatile memory array to store data. Specifically, each of the FeFETs includes a semiconductor substrate having a drain region and a source region, a gate disposed over the semiconductor substrate and a ferroelectric layer disposed between the semiconductor substrate and the gate.

The operating principle of the FeFET is that a polarization direction of the ferroelectric layer can be switched by applying a positive or negative bias to the gate, and the conductance of a channel defined between the source region and the drain region is determined by the polarization direction of the ferroelectric layer. Accordingly, by applying a threshold voltage to the gate for switching the polarization direction of the ferroelectric layer, the resistivity of the FeFET can be changed, and then a state (such as "1" or "0") which has been written into the FeFET can be read by measuring the resistivity of the FeFET.

The conventional ferroelectric layer is usually made of a material having a perovskite structure, such as $Pb(Zr,Ti)O_3$ (PZT) or $SrBi_2Ta_2O_9$ (SBT). However, both the difficulty of the process and the cost for forming a perovskite structure material on a semiconductor substrate are much higher, and the process is not compatible with current silicon fabrication. Accordingly, the cost of the memory device in which the FeFETs are applied is still less competitive than conventional DRAM and NAND memories. Furthermore, only when a thickness of the ferroelectric layer made of PZT or SBT is greater than 200 nm, the ferroelectric layer may exhibit ferroelectric characteristic. It turns out that downsizing of the FeFET is more difficult.

Accordingly, it is highly desirable for one of ordinary skill in the art to develop a material, which is thinner, chipper and easily fabricated, to replace PZT or SBT for being applied to field effect transistors in a memory array.

SUMMARY OF THE INVENTION

The object of the disclosure is to provide a field effect transistor, a memory element and a manufacturing method of a charge storage structure. In the disclosure, the conventional ferroelectric layer made of PZT or SBT used in the FeFET is replaced with a "para-ferroelectric" material, which is a composite material including a paraelectric material and a ferroelectric material, or a laminated structure including a paraelectric material layer and a dielectric material layer.

In order to achieve the aforementioned objects, according to an embodiment of the disclosure, a field effect transistor adapted to a nonvolatile memory device is provided. The field effect transistor includes a substrate, a source region, a drain region, a gate conductive layer and a charge storage structure. The substrate has an upper surface. The source region and the drain region are located in the substrate, connected to the upper surface, and spaced from each other to define a channel region therebetween. The gate conductive layer is disposed over the upper surface and overlaps with the channel region between the source region and the drain region. The charge storage structure is located between the channel region and the gate conductive layer. The charge storage structure includes a ferroelectric material and a paraelectric material.

According to another embodiment of the disclosure, a memory element is provided. The memory element includes a plurality of bit lines extending along a first direction, a plurality of word lines extending a second direction and a plurality of field effect transistors. The bit lines intersect with the word lines to define a plurality of effective zones. The field effect transistors are respectively arranged in the effective zones. Each of the field effect transistors includes a substrate, a source region, a drain region, a gate conductive structure and a charge storage structure. The source region and the drain region are located in the substrate and connected to the upper surface. The drain region and the source region are spaced apart from each other to define a channel region therebetween, and the drain region is electrically connected to one corresponding bit line. The gate conductive layer is disposed over the upper surface, overlaps with the channel region between the source region and the drain region, and electrically connects one corresponding word lines. The charge storage structure is disposed between the channel region and the gate conductive layer, and the charge storage structure includes a ferroelectric material and a paraelectric material.

According to another embodiment of the disclosure, a manufacturing method of a charge storage structure, which is adapted to be applied in the field effect transistor and the memory element, is provided. In the beginning, a laminate including a ferroelectric structure and a paraelectric structure is formed. Subsequently, a heat treatment is performed on the laminate in a high pressure oxygen atmosphere. Next, a heat treatment is performed on the laminate in a high pressure hydrogen or deuterium atmosphere so that atoms in the ferroelectric structure interdiffuse with atoms in the paraelectric structure to form the charge storage structure.

To sum up, in the disclosure, the "para-ferroelectric" material comprising the paraelectric material and the ferroelectric material may be applied in the field effect transistor of the memory element. Comparing to the conventional ferroelectric layer made of PZT or SBT, fabrication of the para-ferroelectric material is easier and the production cost of the para-ferroelectric material can be reduced. Furthermore, by using the composite material (or the laminated structure) including the ferroelectric material and the paraelectric material to manufacture the charge storage structure, the thickness of the charge storage structure could be less than 50 nm. As such, the size of the memory element or the field effect transistor can be further scaled down.

In order to further the understanding regarding the disclosure, the following embodiments are provided along with illustrations to facilitate disclosing of the disclosure.

BRIEF DESCRIPTION OF THE DRAWINGS

FIG. 1 shows a fragmentary sectional schematic view of a field effect transistor in accordance with an embodiment of the disclosure;

FIG. 2A shows a fragmentary sectional schematic view of a field effect transistor in a programmed state in accordance with an embodiment of the disclosure;

FIG. 2B shows a fragmentary sectional schematic view of a field effect transistor in the other programmed state in accordance with an embodiment of the disclosure;

FIG. 3A shows a fragmentary sectional schematic view of a field effect transistor in a programmed state in accordance with another embodiment of the disclosure;

FIG. 3B shows a fragmentary sectional schematic view of a field effect transistor in the other programmed state in accordance with another embodiment of the disclosure;

FIG. 4A shows a fragmentary sectional schematic view of a field effect transistor in a programmed state in accordance with another embodiment of the disclosure;

FIG. 4B shows a fragmentary sectional schematic view of a field effect transistor in the other programmed state in accordance with another embodiment of the disclosure;

DETAILED DESCRIPTION OF THE PREFERRED EMBODIMENTS

Figure 5A:
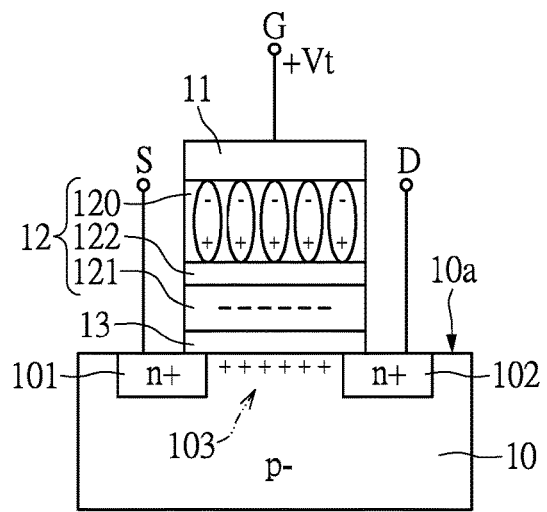
FIG. 5A shows a fragmentary sectional schematic view of a field effect transistor in a programmed state in accordance with another embodiment of the disclosure.

The aforementioned illustrations and following detailed descriptions are exemplary for the purpose of further explaining the scope of the disclosure. Other objectives and advantages related to the disclosure will be illustrated in the subsequent descriptions and appended drawings. In addition, the same reference numerals are given to the same or similar components.

Please refer to FIG. 1. FIG. 1 shows a fragmentary sectional schematic view of a field effect transistor in accordance with an embodiment of the disclosure. The field effect transistor 1 provided in the embodiment of the disclosure can be implemented in a nonvolatile memory element to be served as a memory cell for storing data.

The field effect transistor 1 includes a substrate 10, a source region 101, a drain region 102, a gate conductive layer 11, and a charge storage structure 12.

The substrate 10 may be a semiconductor substrate doped with impurities of a first conductivity type, the semiconductor substrate being made from such as silicon (Si), gallium nitride (GaN), aluminum nitride (AlN), silicon carbide (SiC), indium phosphide (InP), zinc selenide (ZnSe), one of group VI elements, one of group III-V elements, or one of group II-VI elements. Furthermore, the substrate 10 is lightly doped with impurities of the first conductivity type, which can be N-type or P-type.

For example, when the substrate 10 is a silicon substrate and the field effect transistor 1 is a NMOS transistor, the substrate 10 is doped with P-type impurities, which may be one of group IIIA elements, such as boron, aluminum, gallium, and the like. When the substrate 10 is a silicon substrate and the field effect transistor 1 is a PMOS transistor, the substrate 10 is doped with N-type impurities, which may be one of group VA elements, such as nitrogen (N), phosphorus (P), arsenic (As), and the like.

The field effect transistor 1 includes two heavily-doped regions of a second conductivity type, and the two regions are located in the substrate 10 and spaced from each other to be respectively served as a source region 101 and a drain region 102. That is to say, the source region 101 and the drain region 102, each of which has a conductivity type opposite to that of the substrate 10, are spaced from each other by a predetermined distance. Furthermore, the substrate 10 has an upper surface 10a. The source region 101 and the drain region 102 of the substrate 10 is located at a side of the substrate 10 near the upper surface 10a and connected to the upper surface 10a.

When the substrate 10 is lightly doped with P-type impurities, the source region 101 and the drain region 102 are both heavily doped with N-type impurities. On the contrary, when the substrate 10 is lightly doped with N-type impurities, the source region 101 and the drain region 102 are both heavily doped with P-type impurities. The source region 101 and the drain region 102 spaced from each other define a channel region 103 therebetween.

The gate conductive layer 11 is disposed over the upper surface 10a of the substrate 10 and overlaps with the channel region 103 defined between the source region 101 and the drain region 102. The gate conductive layer 11 is made of conductive material, such as titanium nitride (TiN), tantalum nitride (TaN), tungsten nitride (WN$_2$), iridium (Ir), platinum (Pt) or any combination thereof.

In the embodiment of the disclosure, the charge storage structure 12 is disposed between the gate conductive layer 11 and the channel region 103. The charge storage structure 12 includes at least a ferroelectric material and a paraelectric material. That is to say, in the field effect transistor 1 of the embodiment in the disclosure, the ferroelectric material and the paraelectric material are used to replace the conventional ferroelectric layer.

It is worth noting that the paraelectric material has better charge trapping capability. Therefore, when a bias is applied to the gate conductive layer 11, electrons or holes may tunnel from the channel region 103 to the charge storage structure 12 and then be trapped in the charge storage structure 12.

Furthermore, directions of electric dipole moments in the ferroelectric material change with externally applied electric fields, thus a polarization direction of the ferroelectric material is altered accordingly. Since the charge storage structure 12 includes the ferroelectric material, the field effect transistor 1 can be programmed at a higher speed. To be more specific, the polarization direction of the ferroelectric material can be switched at a faster speed so that the tunneling speed of the electrons (or holes) in the channel region 103 can be improved, thereby reducing the time that the field effect transistor 1 is programmed and erased.

The ferroelectric material and the paraelectric material of the charge storage structure 12 can be mixed together, or stacked to form a laminated structure. Structures of the charge storage structure 12 in different embodiments and the operation principle of the field effect transistor 1 will be described as follows.

Please refer to FIG. 2A and FIG. 2B, which respectively show the fragmentary sectional schematic views of a field effect transistor in different programmed states in accordance with an embodiment of the disclosure.

In the embodiment, the charge storage structure 12 is made of the composite material including the ferroelectric material and the paraelectric material. Furthermore, in one embodiment, the composite material further includes hydrogen atoms. In the disclosure, the composite material formed by blending the ferroelectric material with the paraelectric material is defined as "para-ferroelectric material."

The para-ferroelectric material includes hydrogen atoms, which is related to the manufacturing method of the charge storage structure 12. The method will be described in detail in the descriptions below and shall not be elaborated here. When the charge storage structure 12 is made of the para-ferroelectric material, the thickness of the charge storage structure 12 can range from 1 nm to 30 nm. In one preferred embodiment, the thickness of the charge storage structure 12 ranges from 5 nm to 15 nm.

In one embodiment, the paraelectric material is hafnium silicon oxide, and the general formula of the paraelectric material is $Hf_{(1-x)}Si_xO_2$, x being ranged between 0.05 and 0.55. In another embodiment, the paraelectric material can be hafnium silicon oxide doped with a dielectric material, the dielectric material being selected from a group consisting of hafnium oxide, zirconium oxide, titanium oxide, titanium nitride, tantalum nitride, aluminum oxide, tantalum oxide and any combination thereof.

Furthermore, the ferroelectric material includes at least one oxide, which can be an alkaline earth metal oxide or a transition metal oxide. In one embodiment, the ferroelectric material can be hafnium oxide, zirconium oxide or hafnium zirconium oxide. In addition, the ferroelectric material can further include an amount of dopants. The dopants can be selected from a group of silicon, aluminum, yttrium, strontium, gadolinium, lanthanum and any combination thereof. The concentration of the dopants ranges from 2% to 10%. In one embodiment, the general formula of the ferroelectric material is $Hf_{(1-x)}Si_xO_2$, x being ranged between 0.01 and 0.05.

As shown in FIG. 2A and FIG. 2B, the field effect transistor 1 is a NMOS transistor, which is taken as an example to explain the operation principle of the field effect transistor 1 in the embodiment. Accordingly, the substrate 10 is a lightly-doped P-type substrate, and both the source region 101 and the drain region 102 are heavily-doped N-type regions formed in the substrate 10.

As shown in FIG. 2A, the gate conductive layer 11, the source region 101, and the drain region 102 are respectively electrically connected to a gate contact G, a source contact S, and a drain contact D of an external control circuit (not shown in FIG. 2A). When a negative bias (−Vt) is applied to the gate conductive layer 11 through the gate contact G, not all of the polarization directions of the electric dipoles in the charge storage structure 12 (i.e., the para-ferroelectric material) are the same as the direction of the electric field, but the holes in the channel region 103 of the substrate 10 still can tunnel to and then be trapped in the charge storage structure 12. As such, electrons are accumulated in the channel region 103 so as to form a channel between the source region 101 and the drain region 102.

When a bias voltage is applied between the source region 101 and the drain region 102 through the source contact S and the drain contact D such that a potential difference is produced between the source region 101 and the drain region 102, the field effect transistor 1 is turned on to be in a first state.

Furthermore, when a positive bias (+Vt) is applied to the gate conductive layer 11 through the gate contact G, the polarization directions of the electric dipoles in the charge storage structure 12 (i.e., the para-ferroelectric material) allow the electrons in the channel region 103 of the substrate 10 to tunnel to and be trapped in the charge storage structure 12. As such, holes are accumulated at the channel region 103 so that the field effect transistor 1 is turned off to be in a second state.

In one embodiment, the first state can be defined as "1", and the second state can be defined as "0". Accordingly, the field effect transistor 1 can be implemented in the non-volatile memory element to be served as a memory cell to store data.

In another embodiment, the field effect transistor 1 is a PMOS transistor. When a positive bias is applied to the gate conductive layer 11, holes (positive charges) are accumulated in the channel region 103 so that the field effect transistor 1 is turned on and then in the first state. When a negative bias is applied to the gate conductive layer 11, electrons (negative charges) are accumulated in the channel region 103 so that the field effect transistor 1 is turned off and then in the second state.

Please refer to FIG. 3A and FIG. 3B, which respectively show fragmentary sectional schematic views of a field effect transistor in different programmed states in accordance with another embodiment of the disclosure. The elements similar to those shown in FIG. 2A are denoted by similar reference numerals, and redundant descriptions thereof are omitted.

The field effect transistor 1 further includes a tunneling dielectric layer 13 disposed between the charge storage structure 12 and the substrate 10. Specifically, the tunneling dielectric layer 13 has a thickness ranging from 1 nm to 5 nm so as to allow electrons to tunnel into the charge storage structure 12 or from the charge storage structure 12 to the channel region 103.

In one embodiment, the tunneling dielectric layer 13 can be made of silicon oxide or silicon oxy-nitride. Furthermore, the tunneling dielectric layer 12 disposed between the charge storage structure 12 and the substrate 10 can prevent interdiffusion of atoms between the charge storage structure 12 and the substrate 10, thereby improving the reliability of the field effect transistor 1.

The operation principle of the field effect transistor 1 of the embodiment is similar to that of the embodiment shown in FIG. 2A and FIG. 2B. Specifically, by applying a bias to the gate conductive layer 11, electrons may tunnel from the charge storage structure 12 to the substrate 10 or from the substrate 10 to the charge storage structure 12 so that the field effect transistor 1 can be turned on and then in the first state or turned off and then in the second state.

Please refer to FIG. 4A and FIG. 4B, which respectively show fragmentary sectional schematic views of a field effect transistor in different programmed states in accordance with another embodiment of the disclosure.

The difference between the field effect transistor 1 of the embodiment and that in the embodiment of FIG. 2A is that the charge storage structure 12 now is a laminated structure including a paraelectric material layer 121 and a ferroelectric material layer 120 stacked on the paraelectric material layer 121.

In the embodiment, the material of the ferroelectric material layer 120 can include at least one of a doped alkaline earth metal oxide and a doped transition metal oxide. In one embodiment, the material of the ferroelectric material layer 120 is zirconium oxide, hafnium oxide, or hafnium zirconium oxide, each of which includes an amount of dopants. The dopants are selected from a group consisting of silicon, aluminum, yttrium, strontium, gadolinium, lanthanum and any combination thereof. Furthermore, the concentration of the dopants ranges from 2% to 10%. In one embodiment, the general formula of the ferroelectric material is $Hf_{(1-x)}Si_xO_2$, x being ranged between 0.01 and 0.05.

Furthermore, the energy band structure of the paraelectric material layer 121 is a quantum well structure which may improve charge trapping capability of the charge storage structure 12. Specifically, the paraelectric material layer 121 can include a base material and a dielectric material, wherein the base material and the dielectric material are stacked alternately. The energy band structure of the base material may be in coordination with that of the dielectric material to form the quantum well structure.

In one embodiment, a general formula of the base material is $Hf_{(1-x)}Si_xO_2$, x being ranged between 0.02 and 0.65, and the dielectric material includes at least one material selected from a group consisting of hafnium oxide, zirconium oxide, titanium oxide, titanium nitride, tantalum nitride, aluminum oxide, tantalum oxide and any combination thereof. Moreover, the alternately stacked base material and dielectric material may be fabricated by atomic layer deposition (ALD) processes.

The operation principle of the field effect transistor 1 in the embodiment is explained by assuming the field effect transistor 1 is a NMOS transistor. Please refer to FIG. 4A, when the positive bias (+Vt) is applied to the gate conductive layer 11 through the gate contact G, the polarization direction of the ferroelectric material layer 120 aligns with a direction of the electric field, i.e. points from the gate conductive layer 120 to the substrate 10, and the electrons in the channel region 103 of the substrate 10 are allowed to tunnel to and then be trapped in the paraelectric material layer 121. As such, positive charges are accumulated in the channel region 103 so that the field effect transistor 1 is turned off and then in the second state.

On the other hand, when the negative bias (−Vt) is applied to the gate conductive layer 11 through the gate contact G, the polarization direction of the ferroelectric material layer 120 points from the substrate 10 to the gate conductive layer 120, and the electrons in the paraelectric material 121 are allowed to tunnel to and then accumulate in the channel region 103 of the substrate 10. As such, the field effect transistor 1 is turned on and then in the first state.

That is to say, as long as the charge storage structure 12 sandwiched between the gate conductive layer 11 and the channel region 103 includes the ferroelectric material and the paraelectric material, and no matter the ferroelectric material and the paraelectric material are mixed together or stacked alternately, the field effect transistor 1 provided in the disclosure can be applied in the non-volatile memory element to be served as a memory cell for storing data.

Figure 5B:
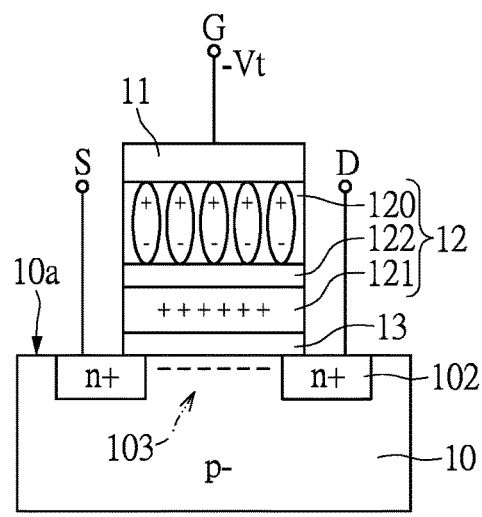
FIG. 5B shows a fragmentary sectional schematic view of a field effect transistor in the other programmed state in accordance with another embodiment of the disclosure.

Please refer to FIG. 5A and FIG. 5B, which respectively show fragmentary sectional schematic views of a field effect transistor in different programmed states in accordance with another embodiment of the disclosure.

The difference between the field effect transistor 1 and that of the embodiment shown in FIG. 4A is that the charge storage structure 12 of this embodiment further includes a blocking layer 122 directly connected to at least one of the ferroelectric material layer 120 and the paraelectric material layer 121.

The blocking layer 122 can be made of silicon oxide, silicon nitride, aluminum oxide, hafnium oxide or any combination thereof. In another embodiment, the blocking layer 122 includes a stacked structure having two silicon oxide layers and a silicon nitride layer interposed between the two silicon oxide layers.

In the embodiment, the blocking layer 122 is disposed between the ferroelectric material layer 120 and the paraelectric material layer 121 so as to prevent interdiffusion of atoms between the ferroelectric material layer 120 and the paraelectric material layer 121, and avoid affecting the characteristic of the charge storage structure 12. However, the arrangements of the ferroelectric material layer 120, the paraelectric material layer 121 and the blocking layer 122 can be adjusted according to practical demands.

Figure 6A:
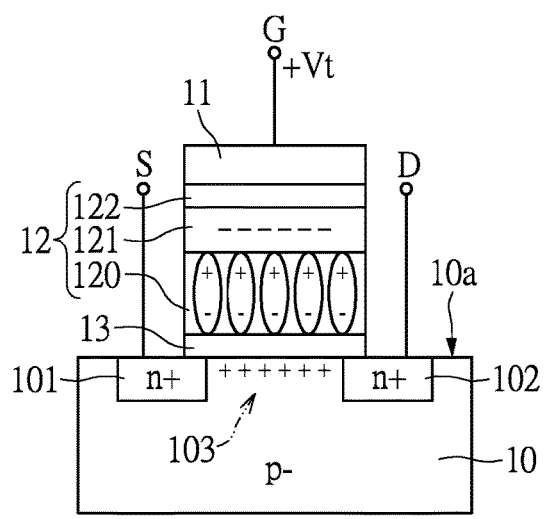
FIG. 6A shows a fragmentary sectional schematic view of a field effect transistor in a programmed state in accordance with another embodiment of the disclosure.
Figure 6B:
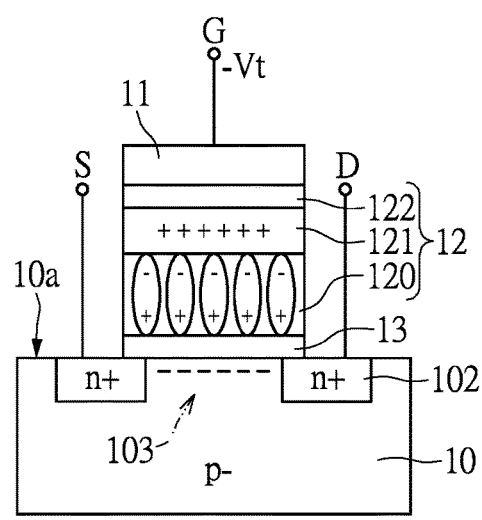
FIG. 6B shows a fragmentary sectional schematic view of a field effect transistor in the other programmed state in accordance with another embodiment of the disclosure.

In another embodiment, as shown in FIG. 6A and FIG. 6B, the blocking layer 122 is disposed between the gate conductive layer 11 and the paraelectric material layer 121, and the ferroelectric material layer 120 is disposed between the paraelectric material layer 121 and the substrate 10.

The operation principles of the field effect transistor 1 shown in FIG. 5A or FIG. 6A are similar to that shown in FIG. 4A, and the operation principles of the field effect transistor 1 shown in FIG. 5B or FIG. 6B are similar to that shown in FIG. 4B, and thus redundant description is omitted here.

Figure 7:
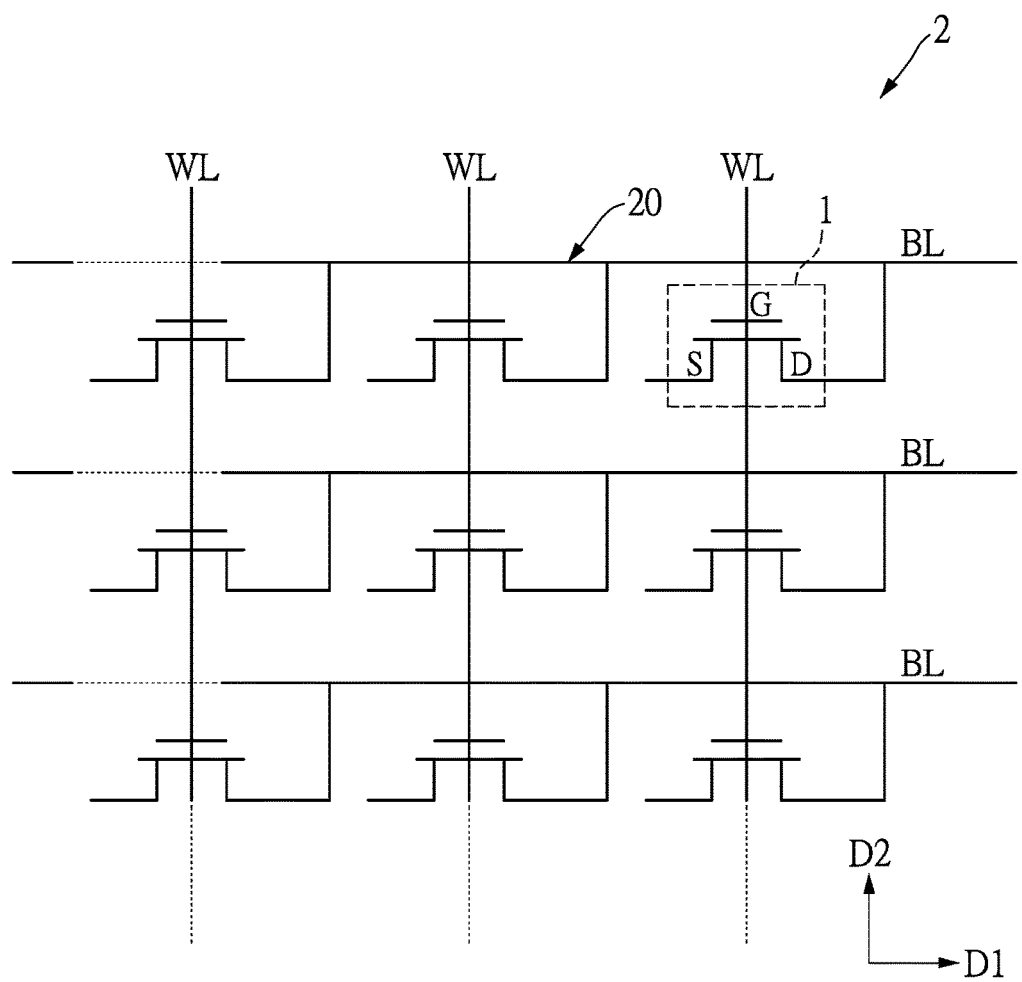
FIG. 7 shows a schematic diagram of an equivalent circuit of a memory element in accordance with an embodiment of the disclosure.

Please refer to FIG. 7, which shows a schematic diagram of an equivalent circuit of a memory element in accordance with an embodiment of the disclosure. The memory element 2 includes a plurality of bit lines BL, a plurality of word lines WL, and a plurality of field effect transistors 1 as shown in FIG. 1.

As shown in FIG. 7, the plurality of bit lines BL extend along a first direction, and the plurality of word lines WL extend along a second direction D2. The word lines WL intersect with the bit lines BL to define a plurality of effective zones 20.

The field effect transistors 1 are respectively arranged in the effective zones 20. In the embodiment of the disclosure, each of the field effect transistors is correspondingly disposed on one of the word lines WL, i.e., on a boundary of the corresponding effective zone 20.

Notably, the drain region 102 of the field effect transistor 1 is electrically connected to the corresponding bit line BL through the corresponding drain contact D, and the gate conductive layer 11 is electrically connected to the corresponding word line WL through the corresponding gate contact G. The word lines WL and the bit lines BL are all connected to a control circuit (not shown in the figure). By controlling the voltages respectively applied to each of the word lines WL and to each of the bit lines BL through the control circuit, data can be written into or erased from each of the field effect transistors 1.

Figure 8:
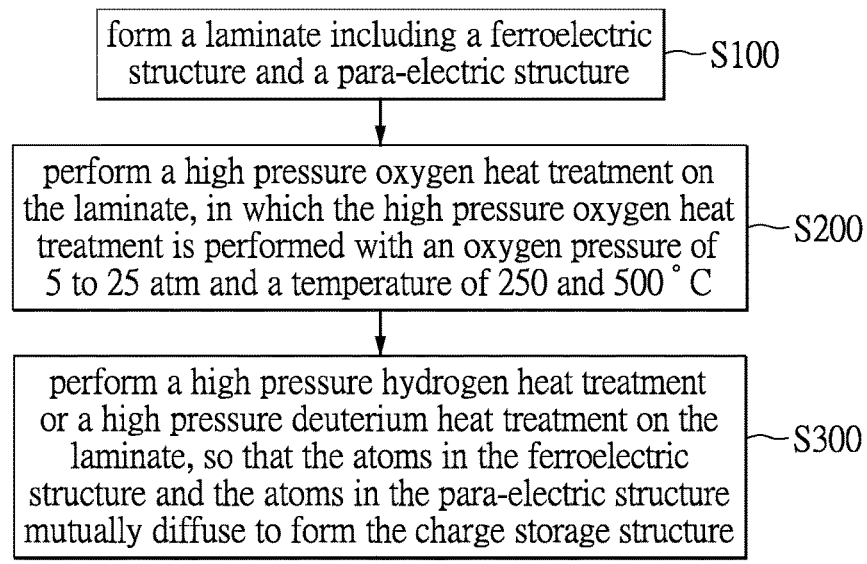
FIG. 8 shows a flowchart of a manufacturing method of a charge storage structure in accordance with an embodiment of the disclosure.

Please refer to FIG. 8, which shows a flowchart of a manufacturing method of a charge storage structure in accordance with an embodiment of the disclosure. To be more specific, the manufacturing method provided in the embodiment of the disclosure can be used to fabricate the aforementioned para-ferroelectric material that can be served as the charge storage structure 12 of the aforementioned field effect transistor 1.

First, in the step S100, a laminate is formed, the laminate including a ferroelectric structure and a paraelectric structure.

Figures 9, 10:
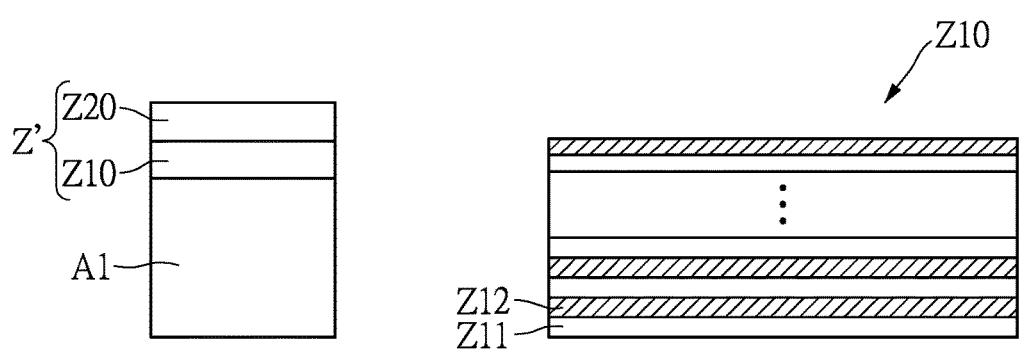
FIG. 9 shows a fragmentary sectional schematic view of the charge storage structure in step S100 shown in FIG. 8 in accordance with an embodiment of the disclosure.
FIG. 10 shows a fragmentary sectional schematic view of a paraelectric structure in accordance with an embodiment of the disclosure.

As shown in FIG. 9, FIG. 9 shows a fragmentary sectional schematic view of the charge storage structure in step S100 of FIG. 8 in accordance with an embodiment of the disclosure.

Specifically, the substrate A1 can be a semiconductor substrate, a metal substrate, or a ceramic substrate, and the material of the substrate A1 can be selected according to the application field of the para-ferroelectric material.

The laminate Z' is formed on the substrate A1 and includes a ferroelectric structure Z20 and a paraelectric structure Z10. A thickness of the laminate Z' ranges from 1 nm to 30 nm. If the charge storage structure is to be applied in a memory element, the thickness of the laminate Z' shall range from 5 nm to 15 nm.

The ferroelectric structure Z20 can be made of one oxide containing dopants, the oxide being one of the alkaline-earth metal oxide and the transition metal oxide. In one embodiment, the oxide is hafnium oxide, zirconium oxide or hafnium zirconium oxide. In addition, the dopants can be selected from a group consisting of silicon, aluminum, yttrium, strontium, gadolinium, lanthanum and any combination thereof. The concentration of the dopants ranges from 2% to 10%. In one embodiment, a general formula of the ferroelectric structure Z20 is $Hf_{(1-x)}Si_xO_2$, x being ranged between 0.01 and 0.05.

In one embodiment, the paraelectric structure Z10 can be made of hafnium oxide, zirconium oxide, titanium oxide, titanium nitride, tantalum nitride, aluminum oxide, tantalum oxide or any combination thereof.

Please refer to FIG. 10, which shows a fragmentary sectional schematic view of a paraelectric structure in accordance with an embodiment of the disclosure. Specifically, the paraelectric structure Z10 includes a base material Z11 and at least one dielectric material Z12, the base material and the dielectric material are stacked alternately. The energy band of the base material Z11 is in coordination with the energy band of the dielectric material Z12 so as to form a quantum wall structure capable of trapping charges.

In one embodiment, a general formula of the base material Z11 is is $Hf_{(1-x)}Si_xO_2$, x being ranged between 0.02 and 0.65, and the dielectric material is selected from a group consisting of hafnium oxide, zirconium oxide, titanium oxide, titanium nitride, tantalum nitride, aluminum oxide, tantalum oxide and any combination thereof. Moreover, in the embodiment, the base material and the dielectric material are formed alternately until the paraelectric structure Z10 has a predetermined thickness.

Figure 11:
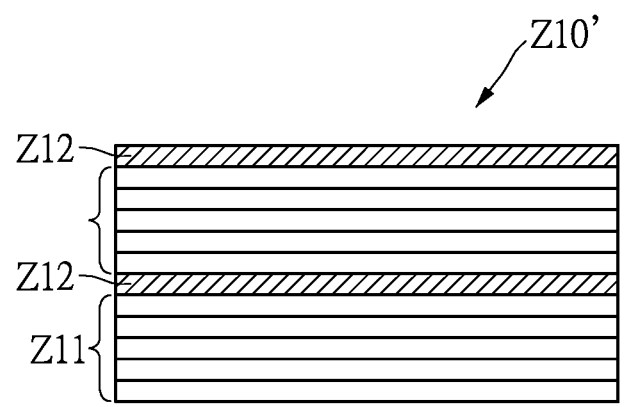
FIG. 11 shows a fragmentary sectional schematic view of a paraelectric structure in accordance with another embodiment of the disclosure.

Please refer to FIG. 11, which shows a fragmentary sectional schematic view of a paraelectric structure in accordance with another embodiment of the disclosure. In the fabrication process of the paraelectric structure Z10' shown in FIG. 11, one layer of dielectric material Z12 is formed after every five layers of base material Z11 are formed, and these two steps are repeated until the paraelectric structure Z10' reaches a predetermined thickness.

Accordingly, as long as the energy band structure of the paraelectric structure Z10 could have the quantum well structure for trapping charges, the embodiment of the disclosure does not intend to limit the order of forming the base material Z11 and the dielectric material Z12.

Furthermore, in one preferred embodiment, the laminate Z' can be formed by atomic layer deposition (ALD) processes. Take the fabrication of the paraelectric structure Z10 as an example, when the base material Z11 is hafnium silicon oxide, the precursor for forming the base material Z11 may include tetrakis (ethylmethylamino) silane (TEMA-Si), tetrakis (ethylmethylamino) hafnium (TEMA-Hf) and ozone ($O_3$), and the deposition temperature can range from 250° C. to 400° C.

When the dielectric material Z12 is hafnium oxide, the precursor for forming the dielectric material Z12 may be tetrakis (ethylmethylamino) hafnium (TEMAH), tetrakis (dimethylamino) hafnium (TDMAH) or hafnium tetrachloride ($HfCl_4$). The oxidizer may be $O_3$ or $H_2O$, and the deposition temperature can range from 150° C. to 400° C.

When the dielectric material Z12 is zirconium oxide, the precursor for forming the dielectric material Z12 may be tetrakis (ethylmethylamin) zirconium (TEMAZ), tetrakis (dimethylamino) zirconium (TDMAZ) or zirconium tetrachloride ($ZrCl_4$). When the dielectric material Z12 is silicon oxide, the precursor for forming the dielectric material Z12 may be tetrakis (dimethylamino) silane (4DMAS), tris (dimethylamino) silane (3DMAS), or $SiCl_4$. When the dielectric material Z12 is aluminum oxide, the precursor for forming the dielectric material Z12 may be trimethyl aluminum or $AlCl_3$.

Accordingly, the precursor suitable for the specific atomic layer deposition process can be determined according to variation of the dielectric material Z12.

Notably, the manufacturing method of the charge storage structure further includes the step of performing a heat treatment on the paraelectric structure Z10 before the ferroelectric structure Z20 is formed on the paraelectric structure Z10. The heat treatment may be a rapid thermal annealing step with a temperature of 500° C. to 1000° C. After the heat treatment is performed, the paraelectric structure Z10 can have better capability of storing charges and a higher dielectric constant. In one embodiment, the dielectric constant of the paraelectric structure Z10 ranges from 30 to 80.

Please refer to FIG. 8. In step S200, a heat treatment in a high pressure oxygen atmosphere is performed on the laminate. Specifically, the heat treatment is performed with an oxygen pressure of 5 to 25 atm and a temperature of 250 and 500° C.

In step S300, a heat treatment in a high pressure hydrogen or deuterium atmosphere is performed on the laminate, so that the atoms in the ferroelectric structure interdiffuse with the atoms in the paraelectric structure to form the charge storage structure.

In the embodiment, during the step of performing the heat treatment in the high pressure hydrogen or deuterium atmosphere, the hydrogen or deuterium pressure ranges from 5 to 25 atm, and the temperature ranges from 250 to 500° C.

Figure 12:
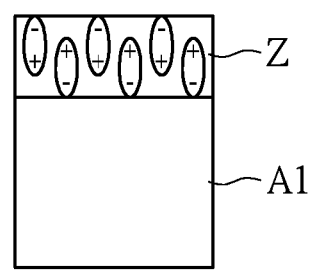
FIG. 12 shows a fragmentary sectional schematic view of the charge storage structure in step S300 shown in FIG. 8 in accordance with an embodiment of the disclosure.

Please refer to FIG. 12, which shows a fragmentary sectional schematic view of the charge storage structure in step S300 of FIG. 8 in accordance with an embodiment of the disclosure.

After the heat treatment in the high pressure oxygen atmosphere and the heat treatment in the high pressure hydrogen (or deuterium) atmosphere have been performed on the laminate Z', the para-ferroelectric structure Z can be formed due to interdiffusion of atoms between the ferroelectric structure Z20 and the paraelectric structure Z10, the para-ferroelectric structure Z serving as the charge storage structure 12 of the field effect transistor 1.

Notably, during the heat treatment in the high pressure hydrogen (or deuterium) atmosphere, hydrogen atoms diffuse into the laminate Z' such that the para-ferroelectric material Z contains hydrogen atoms. Experimental results show that when the para-ferroelectric material Z containing hydrogen atoms is implemented in the field effect transistor 1 to serve as the charge storage structure 12, the charges inside the charge storage structure 12 won't be lost easily, thereby reducing a leakage current of the field effect transistor 1.

Furthermore, after performing the heat treatment in the high pressure oxygen atmosphere and the heat treatment in the high pressure hydrogen (or deuterium) atmosphere, the energy band of the formed para-ferroelectric material Z still keep a quantum well structure. As such, when the para-ferroelectric material Z is implemented in the field effect transistor 1, the para-ferroelectric material Z can be used to trap tunneling electrons (or holes).

To sum up, the beneficial results of the disclosure resides in that the charge storage structure 12 of the field effect transistor 1 uses the paraelectric material and the ferroelectric material to replace the conventional ferroelectric material having a perovskite structure. In addition, the charge storage structure 12 has better capability of trapping charges and a higher switching speed because of the paraelectric material and the ferroelectric material.

Compared with the conventional ferroelectric layer having a perovskite structure, fabrication processes of the paraelectric material and the ferroelectric material are much easier and thus production cost would be lower. Furthermore, the fabrication processes of the paraelectric material and the ferroelectric material can be integrated into the current silicon fabrication. Moreover, by using the composite material (or the laminated structure) of the paraelectric material and the ferroelectric material to manufacture the charge storage structure, charge storage structure may have a thickness less than 50 nm. As such, the size of the memory element 2 or the field effect transistor 1 can be further scaled down.

The descriptions illustrated supra set forth simply the preferred embodiments of the disclosure; however, the characteristics of the disclosure are by no means restricted thereto. All changes, alterations, or modifications conveniently considered by those skilled in the art are deemed to be encompassed within the scope of the disclosure delineated by the following claims.

What is claimed is:

1. A field effect transistor adapted to be implemented in a nonvolatile memory element, comprising:
    a substrate having an upper surface; a source region located in the substrate and connected to the upper surface;
    a drain region located in the substrate and connected to the upper surface, wherein the drain region and the source region are spaced from each other to define a channel region therebetween;
    a gate conductive layer disposed over the upper surface and overlapping with the channel region between the source region and the drain region;
    a charge storage structure located between the channel region and the gate conductive layer, wherein the charge storage structure includes a ferroelectric material and a paraelectric material; and
    a tunneling dielctric layer disposed between the charge storage structure and the substrate.

2. The field effect transistor according to claim 1, wherein the charge storage structure is a laminated structure including a ferroelectric material layer and a paraelectric material layer disposed over a surface of the paraelectric material layer, and an energy band structure of the paraelectric material layer is a quantum well structure.

3. The field effect transistor according to claim 2, wherein the paraelectric material layer includes a base material and a dielectric material, the base material and the dielectric material are stacked alternately, and a general formula of the base material is $Hf_{(1-x)}Si_xO_2$, x being ranged between 0.02 and 0.65, and the dielectric material is selected from a group consisting of hafnium oxide, zirconium oxide, titanium oxide, titanium nitride, tantalum nitride, aluminum oxide, tantalum oxide and any combination thereof.

4. The field effect transistor according to claim 2, wherein the charge storage structure includes a blocking layer connected to one of the ferroelectric material layer and the paraelectric material layer.

5. The field effect transistor according to claim 4, wherein the blocking layer is disposed between the ferroelectric material layer and the paraelectric material layer.

6. The field effect transistor according to claim 4, wherein the blocking layer is disposed between the paraelectric material layer and the gate conductive layer, and the ferroelectric material layer is disposed between the paraelectric material layer and the substrate.

7. The field effect transistor according to claim 4, wherein the blocking layer is disposed between the ferroelectric material layer and the gate conductive layer.

8. The field effect transistor according to claim 1, wherein the charge storage structure is made of a composite material including the ferroelectric material and the paraelectric material.

9. The field effect transistor according to claim 8, wherein the composite material includes hydrogen atoms.

10. A memory element comprising:
    a plurality of bit lines extending along a first direction;
    a plurality of word lines extending along a second direction, wherein the plurality of word lines intersect with the plurality of bit lines to define a plurality of effective zones; and
    a plurality of field effect transistors respectively arranged in the effective zones, wherein each of the field effect transistors includes:
        a substrate having an upper surface;
        a source region located in the substrate and connected to the upper surface;
        a drain region located in the substrate and connected to the upper surface,
        wherein the drain region and the source region are spaced from each other to define a channel region therebetween, and the drain region is electrically connected to one corresponding bit line;
        a gate conductive layer disposed over the upper surface and overlapping with the channel region between the source region and the drain region, wherein the gate conductive layer is electrically connected to one corresponding word line;
        a charge storage structure disposed between the channel region and the gate conductive layer, wherein the charge storage structure includes a ferroelectric material and a paraelectric material; and
        a tunneling dielectric layer disposed between the charge storage structure and the substrate.

11. A manufacturing method of a charge storage structure comprising:
    forming a laminate including a ferroelectric structure and a paraelectric structure;
    performing a heat treatment on the laminate in a high pressure oxygen atmosphere; and performing a heat treatment on the laminate in a high pressure hydrogen or deuterium atmosphere, so that atoms in the ferroelectric structure interdiffuse with atoms in the paraelectric structure to form the charge storage structure.

12. The manufacturing method of the charge storage structure according to claim 11, wherein the heat treatment in a high pressure oxygen atmosphere is performed with an oxygen pressure from 5 to 25 atm and a temperature between 250 and 500° C.

13. The manufacturing method of the charge storage structure according to claim 11, wherein the heat treatment in a high pressure hydrogen or deuterium atmosphere is performed with a hydrogen or deuterium pressure from 5 to 25 atm and a temperature between 250 and 500° C.

14. The manufacturing method of the charge storage structure according to claim 11, wherein the paraelectric structure includes a base material and a dielectric material, the base material and the dielectric material layer are stacked alternately, a general formula of the base material is $Hf_{(1-x)}Si_xO_2$, x being ranged between 0.02 and 0.65, and the dielectric material is selected from a group consisting of hafnium oxide, zirconium oxide, titanium oxide, titanium nitride, tantalum nitride, aluminum oxide, tantalum oxide and any combination thereof.

15. The manufacturing method of the charge storage structure according to claim 11, wherein the ferroelectric structure and the paraelectric structure are fabricated by atomic layer deposition (ALD) processes.

\* \* \* \* \*